(12) United States Patent
Cheah et al.

(10) Patent No.: US 11,887,917 B2
(45) Date of Patent: Jan. 30, 2024

(54) ENCAPSULATED VERTICAL INTERCONNECTS FOR HIGH-SPEED APPLICATIONS AND METHODS OF ASSEMBLING SAME

(71) Applicant: Intel Corporation, Santa Clara, CA (US)

(72) Inventors: Bok Eng Cheah, Bukit Gambir (MY); Jackson Chung Peng Kong, Tanjung Tokong (MY); Kooi Chi Ooi, Glugor (MY); Yang Liang Poh, Penang (MY)

(73) Assignee: Intel Corporation, Santa Clara, CA (US)

( * ) Notice: Subject to any disclaimer, the term of this patent is extended or adjusted under 35 U.S.C. 154(b) by 315 days.

(21) Appl. No.: 17/218,384

(22) Filed: Mar. 31, 2021

(65) Prior Publication Data

US 2021/0217689 A1    Jul. 15, 2021

Related U.S. Application Data

(62) Division of application No. 16/279,656, filed on Feb. 19, 2019, now Pat. No. 11,049,801.

(30) Foreign Application Priority Data

Mar. 30, 2018    (MY) ................................ 2018701318

(51) Int. Cl.
  *H01L 23/498*   (2006.01)
  *H01L 21/48*    (2006.01)
  *H01L 23/00*    (2006.01)

(52) U.S. Cl.
  CPC ...... *H01L 23/49811* (2013.01); *H01L 21/481* (2013.01); *H01L 21/4853* (2013.01); *H01L 23/49822* (2013.01); *H01L 23/49838* (2013.01); *H01L 24/08* (2013.01); *H01L 24/16* (2013.01);
  (Continued)

(58) Field of Classification Search
  CPC ............. H01L 23/49811; H01L 21/481; H01L 21/4853; H01L 23/49822; H01L 23/49838; H01L 24/08; H01L 24/16; H01L 2224/08225; H01L 2224/16227; H01L 2224/04105; H01L 2224/12105; H01L 2224/16237; H01L 2224/73204;
  (Continued)

(56) References Cited

U.S. PATENT DOCUMENTS

2011/0074026 A1*  3/2011  Shim ...................... H01L 21/50
                                                 257/737
2012/0074581 A1   3/2012  Guzek et al.
2014/0117553 A1   5/2014  Ha Woo et al.
(Continued)

OTHER PUBLICATIONS

Kukukawa et al., "Recent Development of Photosensitive Polybenzoxazoles", 2006, Polymer Journal, vol. 38, No. 5, pp. 405-418 (Year: 2006).*

(Continued)

*Primary Examiner* — Selim U Ahmed
*Assistant Examiner* — Evan G Clinton
(74) *Attorney, Agent, or Firm* — Akona IP PC

(57) ABSTRACT

A semiconductor package substrate includes an encapsulated interconnect on a land side of the substrate. The encapsulated interconnect includes an integral metallic structure that has a smaller contact end against the semiconductor package substrate, and a larger contact end for board mounting.

14 Claims, 8 Drawing Sheets

(52) U.S. Cl.
CPC .............. *H01L 2224/08225* (2013.01); *H01L 2224/16227* (2013.01)

(58) Field of Classification Search
CPC . H01L 2924/00014; H01L 2924/19106; H01L 2223/6616; H01L 23/66
See application file for complete search history.

(56) References Cited

U.S. PATENT DOCUMENTS

| | | | | |
|---|---|---|---|---|
| 2015/0325520 | A1* | 11/2015 | Yu ....................... | H01L 23/5384 257/774 |
| 2018/0040585 | A1* | 2/2018 | Yu .......................... | H01L 24/17 |
| 2018/0151485 | A1* | 5/2018 | Kao ...................... | H01L 23/552 |
| 2018/0366436 | A1* | 12/2018 | Wang ................. | H01L 23/3114 |
| 2019/0304885 | A1 | 10/2019 | Cheah et al. | |

OTHER PUBLICATIONS

Madpcb, "Antipad", madpcb.com/glossary/antipad (Year: 2020).*
U.S. Appl. No. 16/279,656, filed Feb. 19, 2019, Encapsulated Vertical Interconnects for High-Speed Applications and Methods of Assembling Same.
"U.S. Appl. No. 16/279,656, Non Final Office Action dated Nov. 27, 2020", 18 pgs.
"U.S. Appl. No. 16/279,656, Notice of Allowance dated Mar. 1, 2021", 10 pgs.
"U.S. Appl. No. 16/279,656, Response filed Jan. 28, 2021 to Non Final Office Action dated Nov. 27, 2020", 12 pgs.
"U.S. Appl. No. 16/279,656, Response filed Nov. 9, 2020 to Restriction Requirement dated Sep. 9, 2020", 8 pgs.
"U.S. Appl. No. 16/279,656, Restriction Requirement dated Sep. 9, 2020", 9 pgs.

* cited by examiner

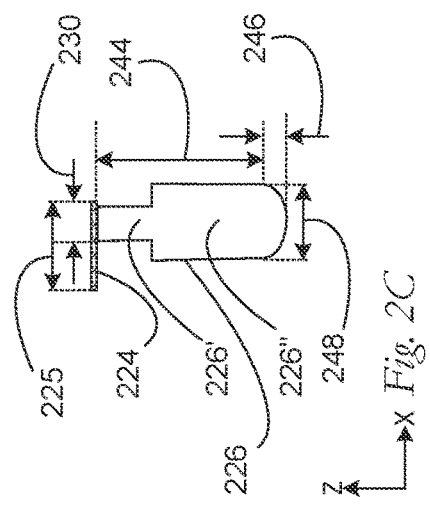
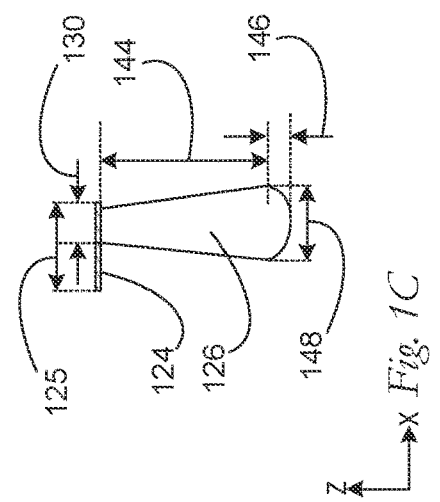
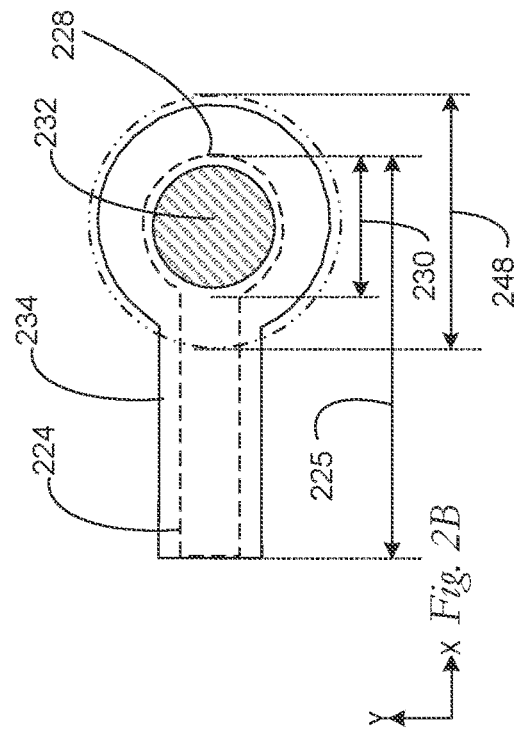
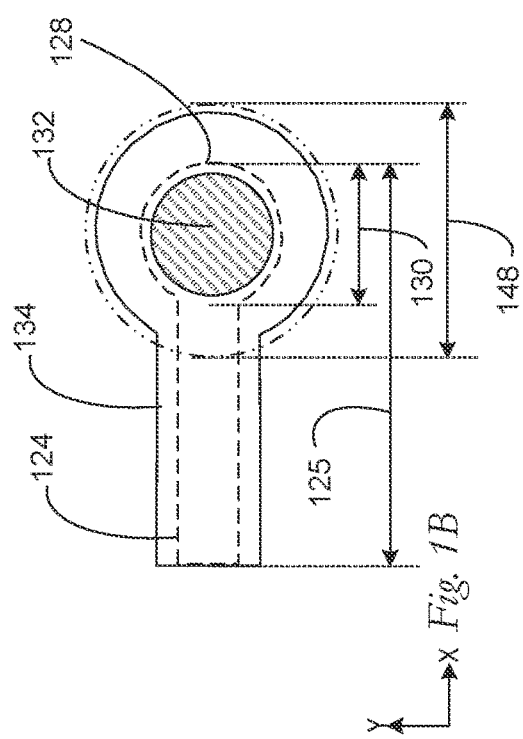

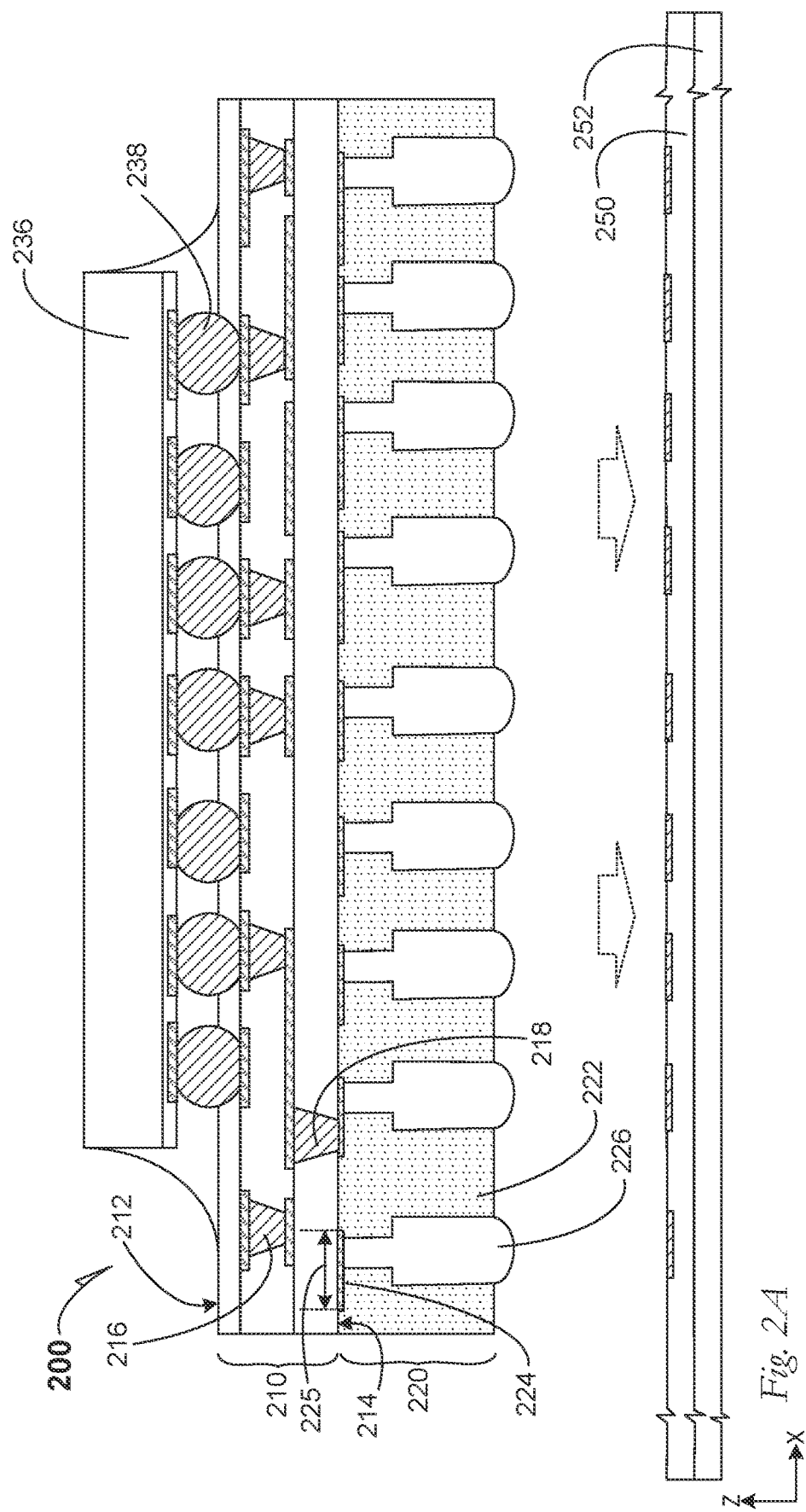

US 11,887,917 B2

ENCAPSULATED VERTICAL INTERCONNECTS FOR HIGH-SPEED APPLICATIONS AND METHODS OF ASSEMBLING SAME

PRIORITY APPLICATION

This application is a divisional of U.S. patent application Ser. No. 16/279,656, filed Feb. 19, 2019, which claims the benefit of priority to Malaysian Application Serial Number PI 2018701318, filed Mar. 30, 2018, each of which is incorporated herein by reference in its entirety.

FIELD

This disclosure relates to land-side interconnects for semiconductor package apparatus.

BACKGROUND

Semiconductive device miniaturization during packaging requires high-speed interconnections.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 1B is a detail section of the land-side trace depicted in FIG. 1A according to an embodiment:

FIG. 1C is a detail view of the vertical interconnect as it contacts the land-side trace according to an embodiment;

FIG. 2A is a cross-section elevation of semiconductor device package with an encapsulated vertical-interconnect according to an embodiment;

FIG. 2B is a detail section of the land-side trace depicted in FIG. 2A according to an embodiment;

FIG. 2C is a detail view of the vertical interconnect as it contacts the land-side trace according to an embodiment;

DETAILED DESCRIPTION

Semiconductor device packages are assembled to improve signal integrity in the range such as 56 GHz for fifth-generation (5G) interconnections in the 60 GHz range. Channel impedance discontinuities and electrical insertion loss are addressed by using encapsulated interconnects on the land side of the semiconductor device packages. Small-contact-area encapsulated vertical interconnects are also located on terminal ends of land-side traces, to increase interconnect density.

In an embodiment, a truncated-cone vertical interconnect shows improved insertion loss of −4.9 decibel (dB) compared to −8.5 dB at 56 GHz with a channel length of about 15 mm for a second-level interconnect on the land side of a semiconductor package substrate.

The land-side interconnects are second-level interconnects as understood where a semiconductive device is first-level connected to the semiconductor device package on the die side, and the second-level interconnect provides a stand-off height that makes both a useful small contact area on a land side trace, and a useful larger contact area for contacting a board such as a motherboard.

Encapsulated vertical interconnects are technically partially encapsulated as they require contact zones at each end for electrical coupling to other structures. In this disclosure and with this description, the vertical interconnects are referred to as encapsulated vertical interconnects.

Figure 1A:
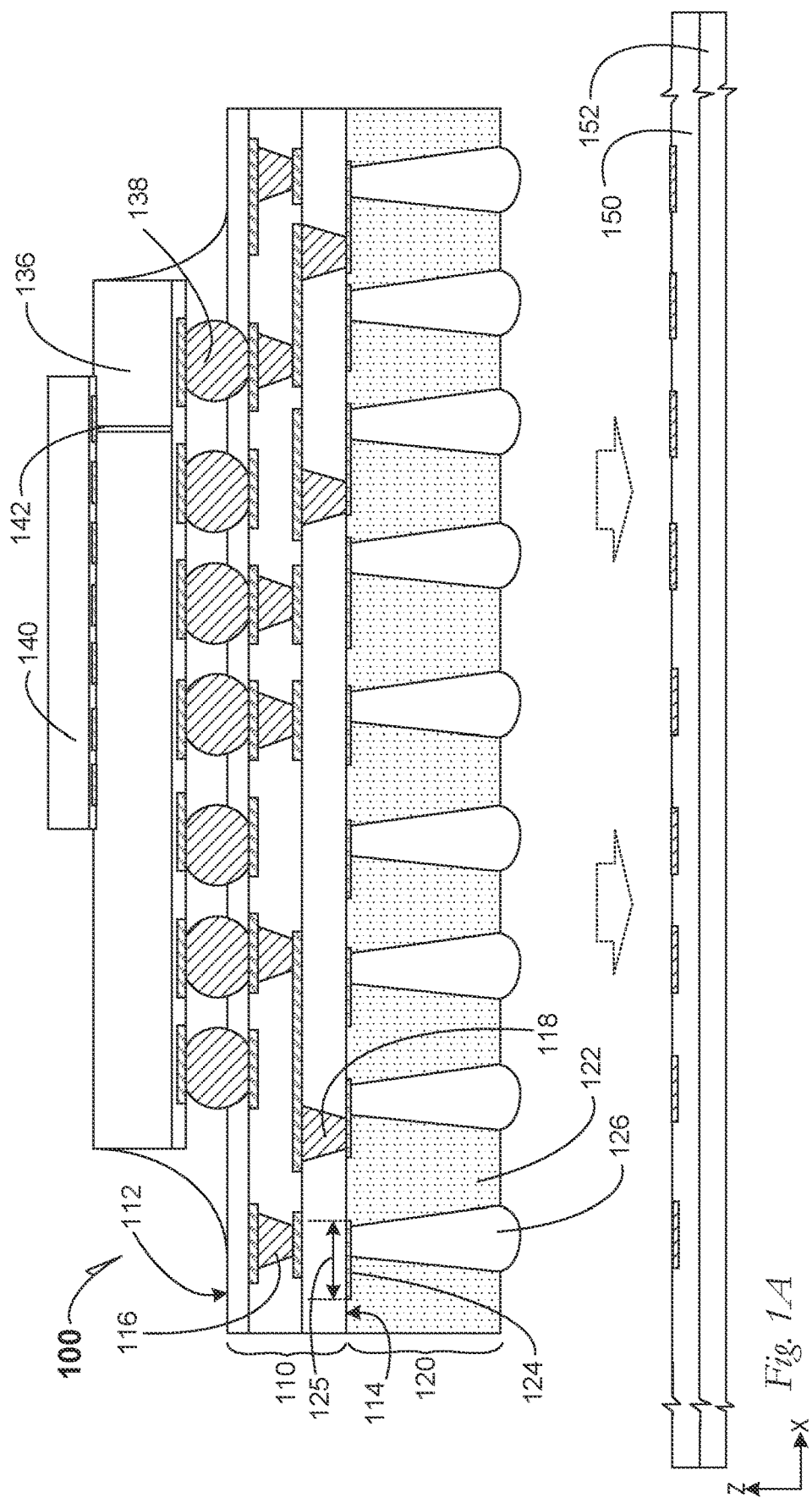
FIG. 1A is a cross-section elevation of semiconductor device package with an encapsulated vertical-interconnect according to an embodiment.

FIG. 1A is a cross-section elevation of semiconductor device package 100 with an encapsulated vertical-interconnect 126 according to an embodiment. In an embodiment, a semiconductor package substrate 110 includes a die side 112 and a land side 114. As illustrated, the semiconductor package substrate 110 is coreless and it has three layers with interlayer interconnects 116 and 118, where the interlayer interconnect 116 communicates to the die side 112 and the interlayer interconnect 118 communicates to the land side 114. In an embodiment, a semiconductor package substrate has a substrate core that uses a vertical encapsulated interconnect.

In an embodiment, an encapsulation structure 120 includes an encapsulation material 122 that contacts the land side 114 of the semiconductor package substrate 110. The encapsulation material 122 also contacts a land-side trace 124 that is part of the semiconductor package substrate 110.

In an embodiment, the encapsulation material 122 is a useful dielectric in a dielectric-constant range from 1.5 to 4. In an embodiment, the encapsulation material 122 is an epoxy rubber-containing composition. In an embodiment, the encapsulation material 122 is a polyethylene-containing composition. In an embodiment, the encapsulation material 122 is a polyimide-containing composition. In an embodiment, the encapsulation material 122 is a polystyrene-containing composition. In an embodiment, the encapsulation material 122 is a natural rubber-containing composition. In an embodiment, the encapsulation material 122 is a silicon rubber-containing composition. In an embodiment, the encapsulation material 122 is a polyester-containing composition. In an embodiment, the encapsulation material 122 is a liquid-crystal polymer-containing composition.

In an embodiment, a vertical interconnect 126 contacts the land-side trace 124 at a terminal end 128 of the trace 124 (see FIG. 1B). Additionally, where the vertical interconnect 126 emerges from the encapsulation material, the vertical interconnect has a diameter 148 that is projected onto the trace 124 (see FIG. 1B).

In an embodiment, the vertical interconnect 126 is formed in the encapsulation material 122 by printing into a contact corridor that exposes the terminal end 128 (see FIG. 1B) of the trace 124. Printing solder material into the encapsulation material 122 is done in an embodiment by pushing a solder-paste precursor into the contact corridor. In an embodiment, the vertical interconnect 126 is formed in the encapsulation material 122 by electroplating by using the trace 124 as a cathode, and the vertical interconnect 126 plates starting at the trace 124 until vertical interconnect growth reaches at least the encapsulation height 144 (see FIG. 1C).

FIG. 1B is a detail section of the land-side trace 124 depicted in FIG. 1A according to an embodiment. The land-side trace 124 is mostly obscured by the encapsulation material 122 depicted in FIG. 1A, the land-side trace 124 is depicted in ghosted lines, and the land-side trace 124 has a trace length 125.

The land-side trace 124 includes a terminal end 128. In an embodiment, the terminal end 128 has a characteristic dimension 130 that is larger than the width of the trace width (along the Y-dimension), in a range from about 1.2 times to about 3 times larger. In each embodiment, the characteristic dimension is observed in a plane that is substantially parallel-planar to the surface of the land side 114.

In an embodiment, the terminal end 128 is circular. In an embodiment and as illustrated, the terminal end 128 has a first characteristic dimension 130, in this case a diameter as that largest dimension because the terminal end 128 is circular. In an embodiment, an exposed portion 132 of the terminal end 128 is circular. In an embodiment, the characteristic dimension 130 is the larger axis of an oval exposed portion of a trace at the terminal end 128. In an embodiment, the characteristic dimension 130 is the larger axis of a rectangular exposed portion of a trace at the terminal end 128, for example, where the exposed portion had a bond-finger form factor although the trace 124 is not expanded at the terminal end 128.

In an embodiment, the exposed portion 132 is seen through an anti-pad material 134 that is used to electrically insulate the trace 124. The anti-pad material 134 obscures a portion of the terminal end 128.

Reference is made to FIG. 1A. In an embodiment, the die side 112 supports a first semiconductive device 136. In an embodiment, the first semiconductive device 136 is flip-chip mounted on the die side 112 through a ball array, one of which is indicated with reference number 138, as illustrated. In an embodiment, although only one semiconductive device 136 is depicted, the die side 112 supports two semiconductive devices including the first semiconductive device 136 as flip-chip mounted, and a subsequent semiconductive device that is also flip-chip mounted on the ball array 138. For example, the first semiconductive device 136 is flip-chip mounted side-by-side with a subsequent semiconductive device (not illustrated) that is also flip-chip mounted on the die side 112.

In an embodiment, the first semiconductive device 136 supports a subsequent semicondcutive device 140 that is die-stacked above the first semiconductive device 136. In an embodiment, the die-stacked subsequent semiconductive device 140 communicates to the first semiconductive device 136 by a through-silicon via (TSV) 142.

FIG. 1C is a detail view of the vertical interconnect 126 as it contacts the land-side trace 124 according to an embodiment. In an embodiment, the vertical interconnect 126 has a truncated-cone form factor. The vertical interconnect 126 is quantified in part by the encapsulation height 144 of the vertical interconnect 126, plus a meniscus height 146. The encapsulation height 144 matches the height of the encapsulation material 122 of the encapsulation structure 120, and the meniscus height 146 represents an electrical-bump mass that is an integral portion of the vertical interconnect. In an embodiment, the meniscus height 146 changes upon mounting the semiconductor device package 100 upon a land 150 (see FIG. 1A) such as a motherboard.

In an embodiment, the land 150 is a printed-wiring board 150 with an external shell 152 that provides at least one of structural and electrical-insulative qualities for the board 150.

In an embodiment, the vertical interconnect 126 can be quantified in form factor by a first form factor, which is the encapsulation height 144, divided by the diameter of the exposed portion 132 of the terminal end 128. In an embodiment, the vertical interconnect 126 can be quantified in form factor by a second form factor, which is the encapsulation height 144, divided by a second diameter 148 of the vertical interconnect 126 where the vertical interconnect emerges from the encapsulation structure 120. In an embodiment, the exposed portion 132 measures seven units and the second diameter measures 13 units, where the encapsulation height 144 is 29 units. With these measurements, the first form factor is 29 divided by seven, and the second form factor is 29 divided by 13. In an embodiment, the first form factor is in a range from 1.5 to 4.5. In an embodiment, the second form factor is in a range from 1.1 to 2.5.

FIG. 2A is a cross-section elevation of semiconductor device package 200 with an encapsulated vertical-interconnect 226 according to an embodiment. In an embodiment, a semiconductor package substrate 210 includes a die side 212 and a land side 214. As illustrated, the semiconductor package substrate 210 is coreless and it has three layers with interlayer interconnects 216 and 218, where the interlayer interconnect 216 communicates to the die side 212 and the interlayer interconnect 218 communicates to the land side 214. In an embodiment, a semiconductor package substrate includes a substrate core and it is contacted by an encapsulated interconnect.

In an embodiment, an encapsulation structure 220 includes an encapsulation material 222 that contacts the land side 214 of the semiconductor package substrate 210. The encapsulation material 222 also contacts a land-side trace 224 that is part of the semiconductor package substrate 210. In an embodiment, a vertical interconnect 226 contacts the land-side trace 224 at a terminal end 228 of the trace 224 (see FIG. 2B). In an embodiment, the vertical interconnect 226 has a stepped right-cylinder form factor.

In an embodiment, formation of the negative space into which the stepped right-cylinder vertical interconnect 226 is done by a first laser that penetrates the encapsulation material 222 to open to the terminal end 228 of the land-side trace 224, followed by a subsequent laser with a wider beam to form the wider negative space for the vertical interconnect 226, where it emerges from the encapsulation structure 220. In an embodiment, different laser intensities are used, such that the subsequent laser penetrates only to form the larger negative space in the encapsulation material 222 where a resulting stepped right-cylindrical contact corridor is formed.

FIG. 2B is a detail section of the land-side trace 224 depicted in FIG. 2A according to an embodiment. The land-side trace 224 is mostly obscured by the encapsulation material 222 depicted in FIG. 2A, and the land-side trace 224 is depicted in ghosted lines, and the land-side trace 224 has a trace length 225.

The land-side trace 224 includes a terminal end 228 that is circular in an embodiment. In an embodiment and as illustrated, the terminal end 228 has a first characteristic dimension 230, in this case a diameter as that largest dimension because the terminal end 228 is circular.

FIG. 2C is a detail view of the vertical interconnect 226 as it contacts the land-side trace 224 according to an embodiment. In an embodiment, the vertical interconnect 226 has a stepped right-cylinder form factor.

In an embodiment, an exposed portion 232 (see FIG. 2B) of the terminal end 228 is circular. In an embodiment, the stepped right-cylinder form factor of the vertical interconnect 226 is quantified by a first portion 226' that has substantially the same dimension of the exposed portion 232 of the terminal end 228 of the trace 224, and a subsequent portion 226" that has a subsequent characteristic dimension 248.

In an embodiment, the characteristic dimension 230 is the larger axis of an oval exposed portion of a trace at the terminal end. In an embodiment, the characteristic dimension 230 is the larger axis of a rectangular exposed portion of a trace at the terminal end, for example, where the exposed portion had a bond-finger form factor although the trace is not expanded at the terminal end.

In an embodiment, the exposed portion 232 is seen through an anti-pad material 234 (see FIG. 2B) that is used to electrically insulate the trace 224.

The vertical interconnect 226 is quantified in part by the encapsulation height 244 of the vertical interconnect 226, plus a meniscus height 246. The encapsulation height 244 matches the height of the encapsulation material 222 of the encapsulation structure 220, and the meniscus height 246 represents an electrical-bump mass that is an integral portion of the vertical interconnect 226.

In an embodiment, the meniscus height 246 changes upon mounting the semiconductor device package 200 upon a land 250 (see FIG. 2A) such as a motherboard.

Reference is made to FIG. 2A. In an embodiment, the die side 212 supports a first semiconductive device 236. In an embodiment, the first semiconductive device 236 is flip-chip mounted on the die side 212 through a ball array, one of which is indicated with reference number 238, as illustrated. In an embodiment, although only one semiconductive device 236 is depicted, the die side 212 supports two semiconductive devices including the first semiconductive device 236 as flip-chip mounted, and a subsequent semiconductive device that is also flip-chip mounted on the ball array 238. For example, the first semiconductive device 236 is flip-chip mounted side-by-side with a subsequent semiconductive device (not illustrated) that is also flip-chip mounted on the die side 212.

In an embodiment, the first semiconductive device 236 is coupled to and supports a subsequent semicondcutive device similar to the subsequent semiconductive device 140 depicted in FIG. 1A.

In an embodiment, the land 250 is a printed-wiring board 250 with an external shell 252 that provides at least one of structural and electrical-insulative qualities for the board 250.

In an embodiment, the vertical interconnect 226 can be quantified in form factor by a first form factor, which is the encapsulation height 244, divided by the diameter of the exposed portion 232 of the terminal end 228. In an embodiment, the vertical interconnect 226 can be quantified in form factor by a second form factor, which is the encapsulation height 244, divided by the second diameter 248 of the vertical interconnect 226 where the vertical interconnect emerges from the encapsulation structure 220. In an embodiment, the exposed portion 232 measures seven units and the and the second diameter 248 measures 13 units, where the encapsulation height 244 is 29 units. With these measurements, the first form factor is 29 divided by seven, and the second form factor is 29 divided by 13. In an embodiment, the first form factor is in a range from 1.5 to 4.5. In an embodiment, the second form factor is in a range from 1.1 to 2.5.

Figure 3:
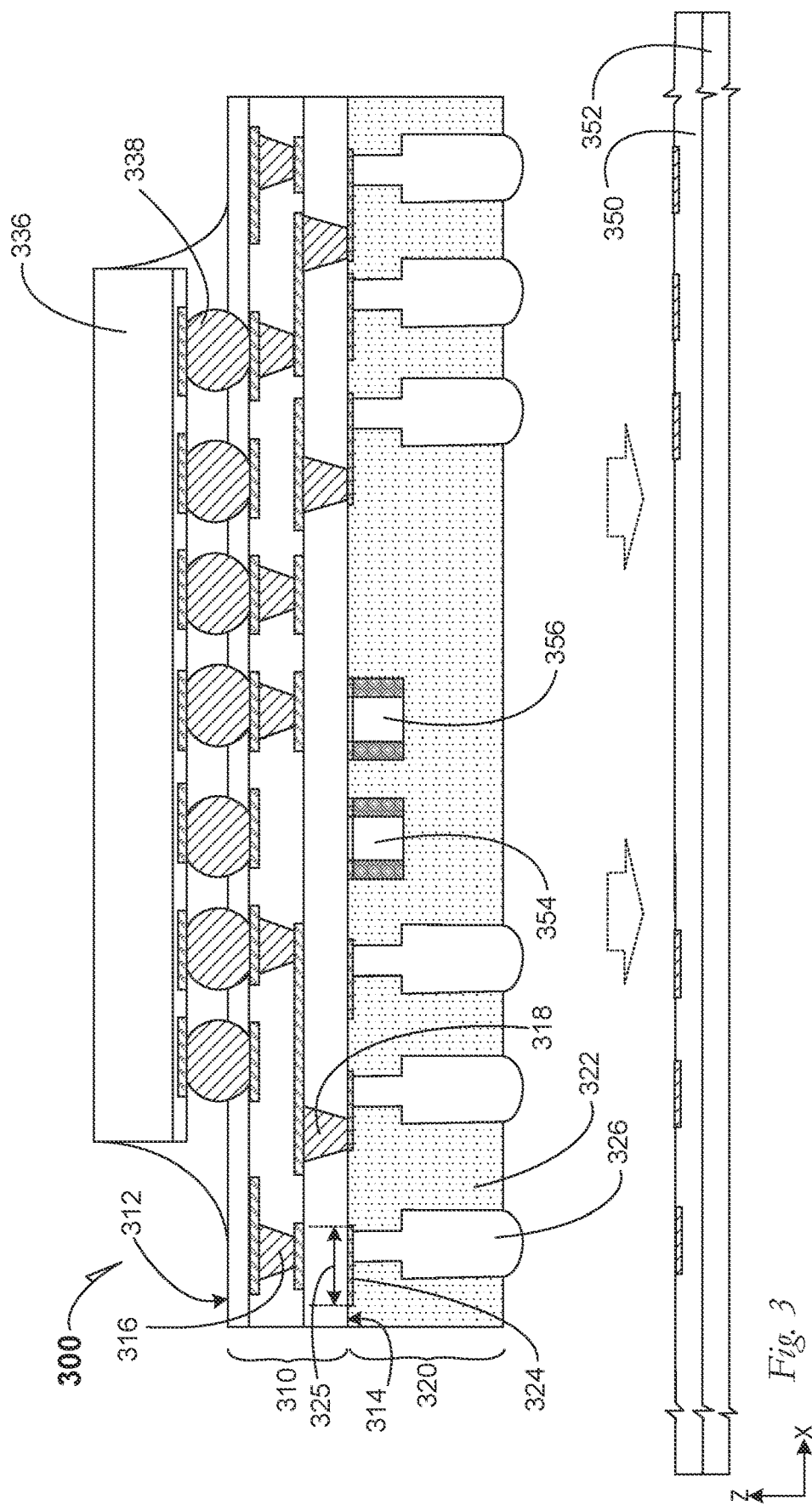
FIG. 3 is a cross-section elevation of semiconductor device package with an encapsulated vertical-interconnect and a land-side passive device according to an embodiment.

FIG. 3 is a cross-section elevation of semiconductor device package 300 with an encapsulated vertical-interconnect and a land-side passive device according to an embodiment. In an embodiment, a semiconductor package substrate 310 includes a die side 312 and a land side 314, and land-side passive 354 is mounted on the land side 314. As illustrated, the semiconductor package substrate 310 is coreless and it has three layers with interlayer interconnects 316 and 318, where the interlayer interconnect 316 communicates to the die side 312 and the interlayer interconnect 318 communicates to the land side 314.

In an embodiment, an encapsulation structure 320 includes an encapsulation material 322 that contacts the land side 314 of the semiconductor package substrate 310. The encapsulation material 322 also contacts a land-side trace 324 that is part of the semiconductor package substrate 310. In an embodiment, a vertical interconnect 326 contacts the land-side trace 324 at a terminal end of the trace 324. In an embodiment, the land-side trace 324 has a trace length 325. In an embodiment, the vertical interconnect 326 has a stepped right-cylinder form factor.

Processing to seat the passive 354 on the land side 314 is done by a pick-and-place technique, followed by forming the encapsulation material 322. In an embodiment, the passive device has a vertical (Z-direction) measurement of 330 micrometer (μm).

In an embodiment, the passive 354 is a capacitor. In an embodiment, the passive 354 is an inductor. In an embodiment, the passive 354 is a resistor. In an embodiment, the passive 354 is a first passive 354 and a subsequent passive 356 is also disposed on the land side 314. In an embodiment, the first passive 354 is one device type, such as any previously named passive type, and the subsequent passive 356 is any previously named passive type including matching the first passive 354 in type. Although the first and subsequent passives 354 and 356 are depicted, in an embodiment, a third passive (not illustrated) is also seated on the land side 314.

In an embodiment, the vertical interconnect 326 has a stepped right-cylinder form factor.

In an embodiment, the die side 312 supports a first semiconductive device 336. In an embodiment, the first semiconductive device 336 is flip-chip mounted on the die side 312 through a ball array, one of which is indicated with reference number 338, as illustrated. In an embodiment, although only one semiconductive device 336 is depicted, the die side 312 supports two semiconductive devices including the first semiconductive device 336 as flip-chip mounted, and a subsequent semiconductive device that is also flip-chip mounted on the ball array 338. For example, the first semiconductive device 336 is flip-chip mounted side-by-side with a subsequent semiconductive device (not illustrated) that is also flip-chip mounted on the die side 312.

In an embodiment, the first semiconductive device 336 is coupled to and supports a subsequent semicondcutive device similar to the subsequent semiconductive device 140 depicted in FIG. 1A.

In an embodiment, a land 350 is a printed-wiring board 350 with an external shell 352 that provides at least one of structural and electrical-insulative qualities for the board 350.

In an embodiment, the vertical interconnect 326 can be quantified in form factor similar to the form-factor parameters described for the vertical interconnect 226 depicted in FIGS. 2A, 2B and 2C.

Figure 4:
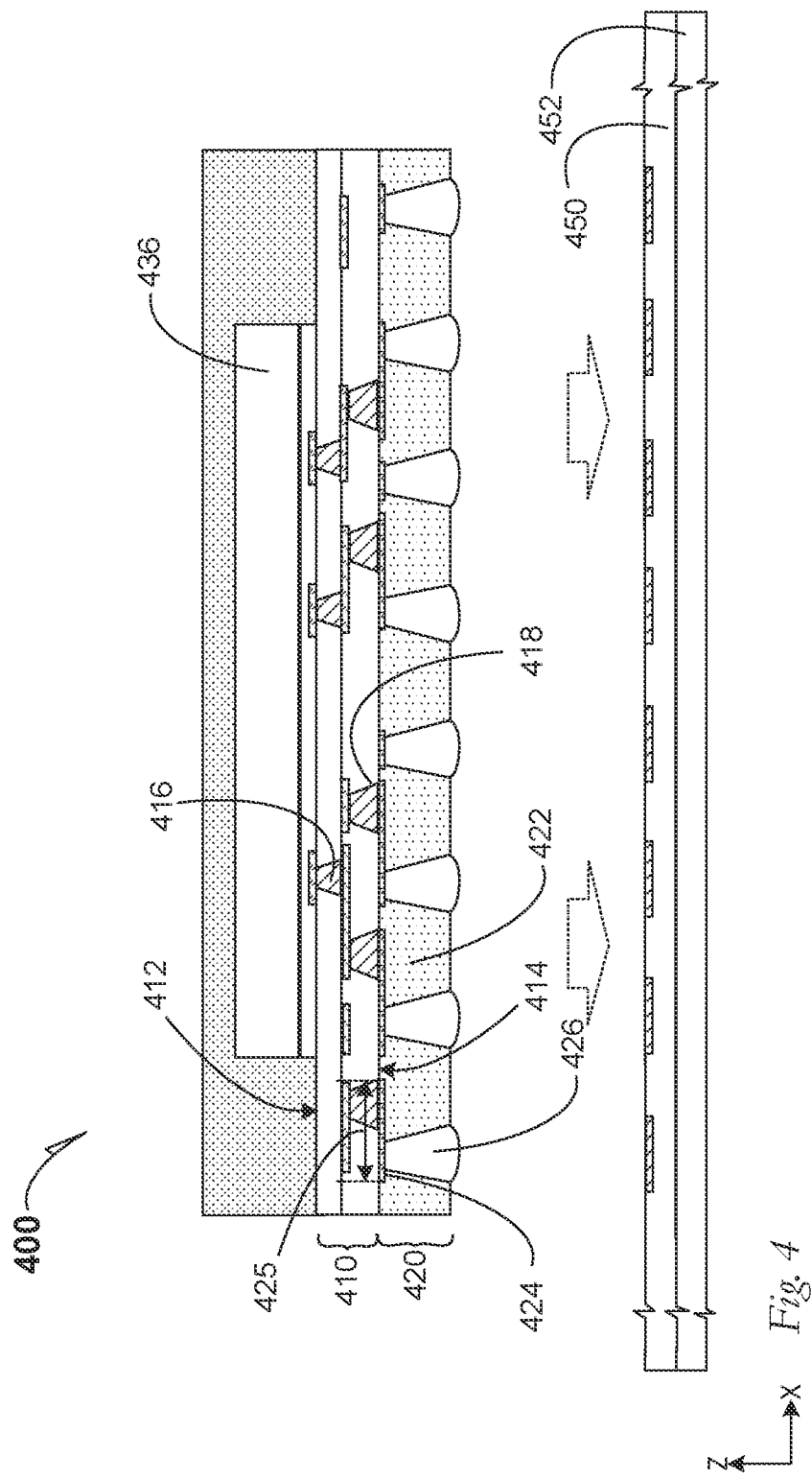
FIG. 4 is a cross-section elevation of a semiconductor device package with an encapsulated vertical-interconnects according to an embodiment.

FIG. 4 is a cross-section elevation of a semiconductor device package 400 with an encapsulated vertical-interconnects according to an embodiment. In an embodiment, a semiconductor package substrate 410 includes a die side 412 and a land side 414. As illustrated, the semiconductor package substrate 410 is coreless and it has two layers with interlayer interconnects 416 and 418, where the interlayer interconnect 416 communicates to the die side 412 and the interlayer interconnect 418 communicates to the land side 414.

In an embodiment, an encapsulation structure 420 includes an encapsulation material 422 that contacts the land side 414 of the semiconductor package substrate 410. The encapsulation material 422 also contacts a land-side trace 424 that is part of the semiconductor package substrate 410. In an embodiment, a vertical interconnect 426 contacts the land-side trace 424 at a terminal end of the trace 424. In an embodiment, the land-side trace 424 has a trace length 425.

In an embodiment, the vertical interconnect 426 has a truncated-cone form factor. In an embodiment, the die side 412 supports a first semiconductive device 436.

In an embodiment, the first semiconductive device 436 is face-mounted on the die side 412 by direct contact with interconnects such as the interconnects 416 where the interconnect 416 communicates to the die side 412 of the semiconductor substrate 410.

In an embodiment, although only one semiconductive device 436 is depicted, the die side 412 supports two semiconductive devices including the first semiconductive device 436 as face-mounted on the die side 412, and a subsequent semiconductive device that is also face-mounted on the die side 412. For example, the first semiconductive device 436 is face-mounted side-by-side with a subsequent semiconductive device (not illustrated) that is also face-mounted on the die side 412.

In an embodiment, the first semiconductive device 436 is coupled to and supports a subsequent semicondcutive device similar to the subsequent semiconductive device 140 depicted in FIG. 1A.

In an embodiment, the vertical interconnect 426 can be quantified in form factor similar to the form-factor parameters described for the vertical interconnect 126 depicted in FIGS. 1A, 1B and 1C.

Figure 5:
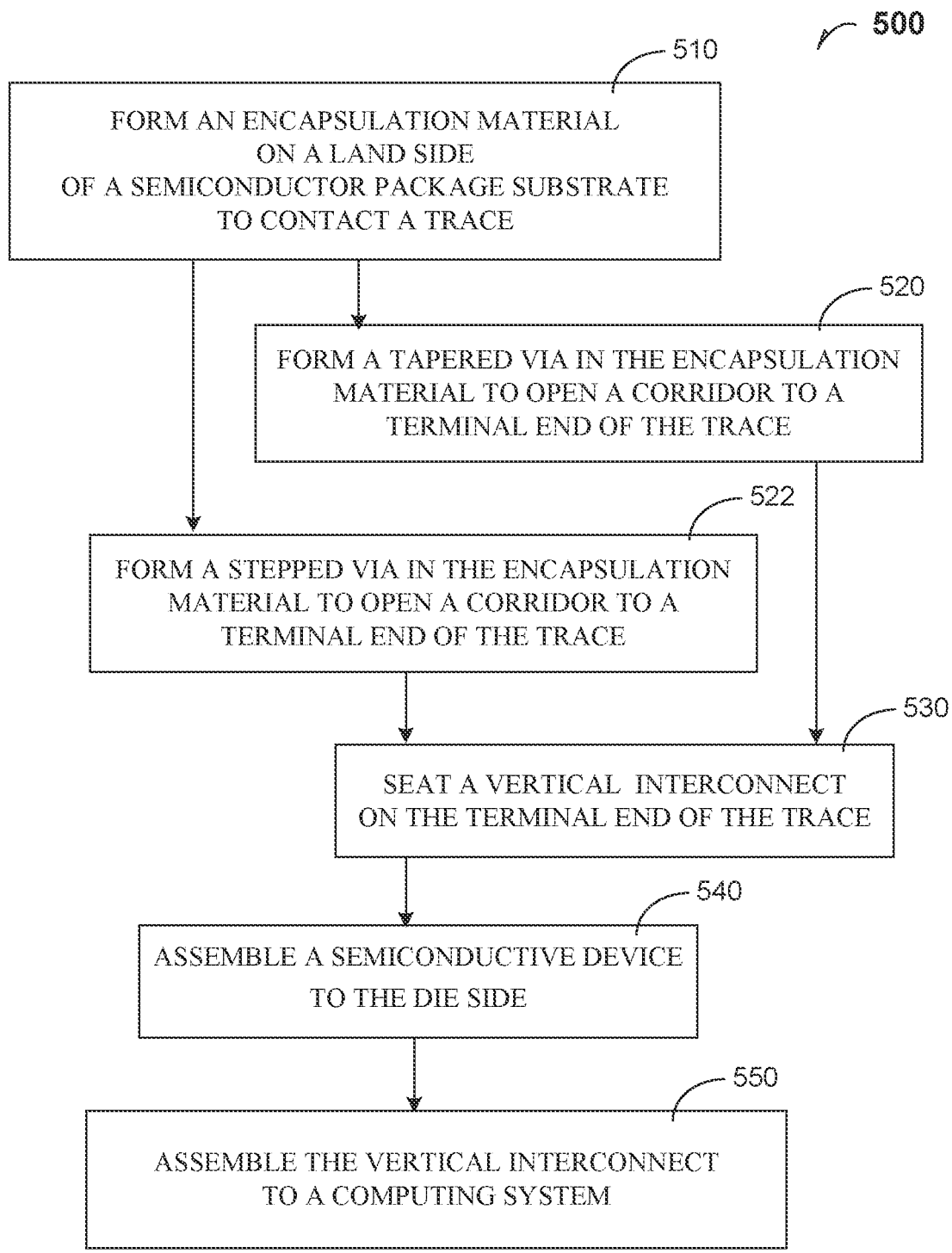
FIG. 5 is a process flow diagram according to several embodiments.

FIG. 5 is a process flow diagram according to several embodiments.

At 510, the process includes forming an encapsulation material on a land side of a semiconductor package substrate to contact a trace.

At 520, the process includes forming a tapered via in the encapsulation material to open a corridor to a terminal end of the trace.

At 522, the process includes forming a stepped via in the encapsulation material to open a corridor to a terminal end of the trace.

At 530, the process includes seating a vertical contact on the terminal end of the trace.

At 540, the process includes assembling a semiconductive device to the die side of the semiconductor package substrate.

At 550, the process includes assembling the vertical interconnect to a computing system.

Figure 6:
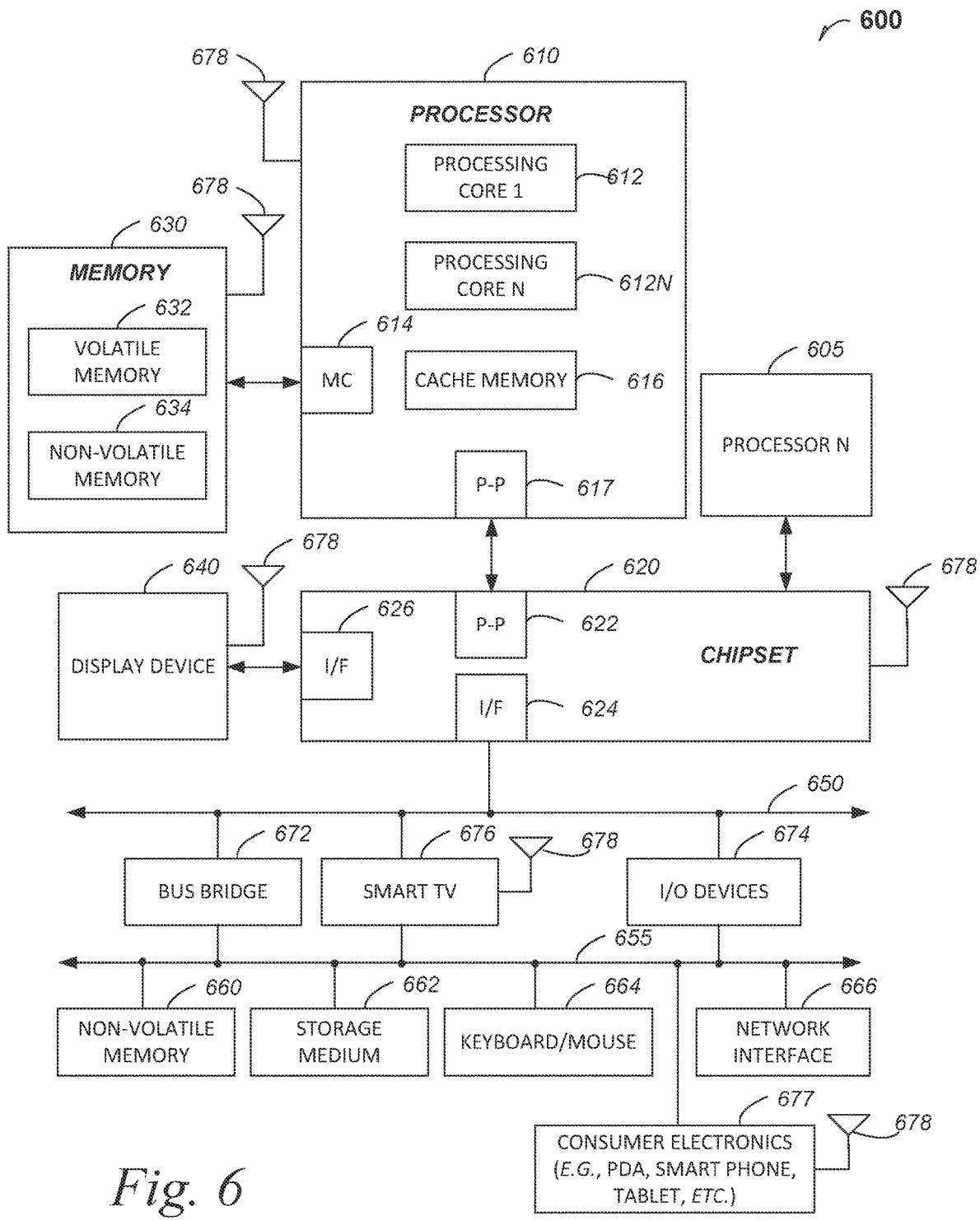
FIG. 6 is included to show an example of a higher-level device application for the disclosed embodiments.

FIG. 6 is included to show an example of a higher-level device application for the disclosed embodiments. The encapsulated vertical interconnect embodiments may be found in several parts of a computing system. In an embodiment, the encapsulated vertical interconnect embodiments can be part of a communications apparatus such as is affixed to a cellular communications tower. In an embodiment, a computing system 600 includes, but is not limited to, a desktop computer. In an embodiment, a system 600 includes, but is not limited to a laptop computer. In an embodiment, a system 600 includes, but is not limited to a tablet. In an embodiment, a system 600 includes, but is not limited to a notebook computer. In an embodiment, a system 600 includes, but is not limited to a personal digital assistant (PDA). In an embodiment, a system 600 includes, but is not limited to a server. In an embodiment, a system 600 includes, but is not limited to a workstation. In an embodiment, a system 600 includes, but is not limited to a cellular telephone. In an embodiment, a system 600 includes, but is not limited to a mobile computing device. In an embodiment, a system 600 includes, but is not limited to a smart phone. In an embodiment, a system 60 includes, but is not limited to an internet appliance. Other types of computing devices may be configured with the microelectronic device that includes encapsulated vertical interconnect apparatus embodiments.

In an embodiment, the processor 610 has one or more processing cores 612 and 612N, where 612N represents the Nth processor core inside processor 610 where N is a positive integer. In an embodiment, the electronic device system 600 using an encapsulated vertical interconnect embodiment that includes multiple processors including 610 and 605, where the processor 605 has logic similar or identical to the logic of the processor 610. In an embodiment, the processing core 612 includes, but is not limited to, pre-fetch logic to fetch instructions, decode logic to decode the instructions, execution logic to execute instructions and the like. In an embodiment, the processor 610 has a cache memory 616 to cache at least one of instructions and data for the multi-layer solder resist on a semiconductor device package substrate in the system 600. The cache memory 616 may be organized into a hierarchal structure including one or more levels of cache memory.

In an embodiment, the processor 610 includes a memory controller 614, which is operable to perform functions that enable the processor 610 to access and communicate with memory 630 that includes at least one of a volatile memory 632 and a non-volatile memory 634. In an embodiment, the processor 610 is coupled with memory 630 and chipset 620. In an embodiment, the chipset 620 is part of an encapsulated vertical interconnect embodiment depicted in any of FIGS. 1-4. The processor 610 may also be coupled to a wireless antenna 678 to communicate with any device configured to at least one of transmit and receive wireless signals. In an embodiment, the wireless antenna interface 678 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 634 includes, but is not limited to, flash memory, phase change memory (PCM), read-only memory (ROM), electrically erasable programmable read-only memory (EEPROM), cross-point memory or any other type of non-volatile memory device.

The memory 630 stores information and instructions to be executed by the processor 610. In an embodiment, the memory 630 may also store temporary variables or other intermediate information while the processor 610 is executing instructions. In the illustrated embodiment, the chipset 620 connects with processor 610 via Point-to-Point (PtP or P-P) interfaces 617 and 622. Either of these PtP embodiments may be achieved using an encapsulated vertical interconnect embodiment as set forth in this disclosure. The chipset 620 enables the processor 610 to connect to other elements in an encapsulated vertical interconnect embodiment in a system 600. In an embodiment, interfaces 617 and 622 operate in accordance with a PtP communication protocol such as the Intel) QuickPath Interconnect (QPI) or the like. In other embodiments, a different interconnect may be used.

In an embodiment, the chipset 620 is operable to communicate with the processor 610, 605N, the display device 640, and other devices 672, 676, 674, 660, 662, 664, 666, 677, etc. The chipset 620 may also be coupled to a wireless antenna 678 to communicate with any device configured to at least do one of transmit and receive wireless signals.

The chipset 620 connects to the display device 640 via the interface 626. The display 640 may be, for example, a liquid crystal display (LCD), a plasma display, cathode ray tube (CRT) display, or any other form of visual display device. In an embodiment, the processor 610 and the chipset 620 are merged into an encapsulated vertical interconnect embodiment in a system. Additionally, the chipset 620 connects to one or more buses 650 and 655 that interconnect various elements 674, 660, 662, 664, and 666. Buses 650 and 655 may be interconnected together via a bus bridge 672 such as at least one encapsulated vertical interconnect embodiment. In an embodiment, the chipset 620, via interface 624, couples with a non-volatile memory 660, a mass storage device(s) 662, a keyboard/mouse 664, a network interface 666, smart TV 676, and the consumer electronics 677, etc.

In an embodiment, the mass storage device 662 includes, but is not limited to, a solid-state drive, a hard disk drive, a universal serial bus flash memory drive, or any other form of computer data storage medium. In one embodiment, the network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the encapsulated vertical interconnect embodiments in a computing system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into the processor core 612.

Figure 7:
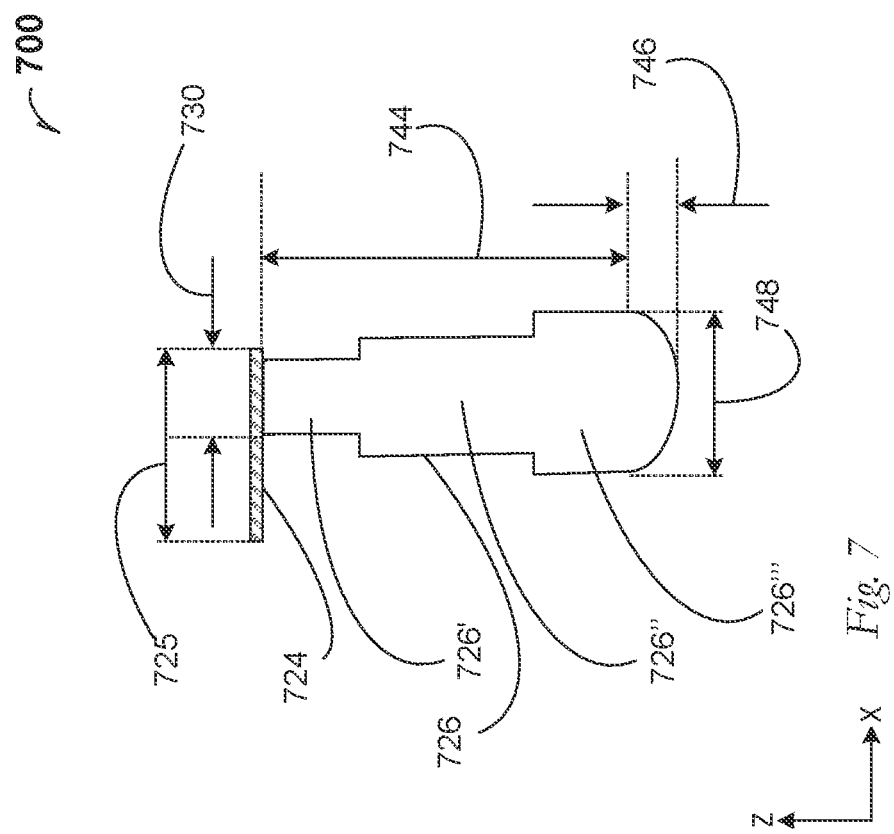
FIG. 7 is a detail view of a vertical interconnect as it contacts a land-side trace according to an embodiment.

FIG. 7 is a detail view of a vertical interconnect 726 as it contacts a land-side trace 724 according to an embodiment. In an embodiment, the trace 724 has a trace length 725. In an embodiment, the vertical interconnect 726 has a stepped right-cylinder form factor with more than one step.

In an embodiment, an exposed portion such as the exposed portion 232 in FIG. 2B, of the terminal end 228 is circular. In an embodiment, the stepped right-cylinder form factor of the vertical interconnect 726 is quantified by a first portion 726', a second portion 726" and a subsequent portion 726'''.

In an embodiment, a characteristic dimension 730 and a subsequent characteristic dimension 748 help define some of the form factor of the vertical interconnect 726. In an embodiment, the characteristic dimension 730 is the larger axis of an oval exposed portion of a trace at the terminal end. In an embodiment, the characteristic dimension 730 is the larger axis of a rectangular exposed portion of a trace at the terminal end, for example, where the exposed portion had a bond-finger form factor although the trace is not expanded at the terminal end.

The vertical interconnect 726 is quantified in part by an encapsulation height 744 of the vertical interconnect 726, plus a meniscus height 746. The encapsulation height 744 matches the height of the encapsulation material of an encapsulation structure such as the encapsulation structure 220 depicted in FIG. 2A, and the meniscus height 746 represents an electrical-bump mass that is an integral portion of the vertical interconnect 726. In an embodiment, the meniscus height 746 changes upon contacting the vertical interconnect 726 upon a land such as on a motherboard.

To illustrate the encapsulated vertical interconnect embodiments and methods disclosed herein, a non-limiting list of examples is provided herein:

Example 1 is a semiconductor package substrate, comprising: a semiconductor device substrate including a die side and a land side; a trace on the land side, wherein the trace is coupled to the die side; an encapsulation material that contacts the land side and the trace, wherein the encapsulation material includes an encapsulation height; and an interconnect that penetrates the encapsulation material and contacts the trace at a terminal end thereof, wherein the interconnect has a first characteristic dimension that contacts the trace, and a second characteristic dimension that extends beyond the encapsulation height, wherein the second characteristic dimension is larger than the first characteristic dimension.

In Example 2, the subject matter of Example 1 optionally includes wherein the interconnect fills a contact corridor in the encapsulation material.

In Example 3, the subject matter of any one or more of Examples 1-2 optionally include wherein the interconnect includes a frusto-conical form factor.

In Example 4, the subject matter of any one or more of Examples 1-3 optionally include wherein the interconnect includes a frusto-conical form factor, further including an electrical-bump mass that is an integral portion of the interconnect, wherein the electrical-bump mass extends beyond the encapsulation height.

In Example 5, the subject matter of any one or more of Examples 1-4 optionally include wherein the interconnect includes a frusto-conical form factor, further including: an electrical-bump mass that is an integral portion of the interconnect, wherein the electrical-bump mass extends beyond the encapsulation height; and a board onto which the electrical bump mass is electrically bonded to a bond pad.

In Example 6, the subject matter of any one or more of Examples 1-5 optionally include wherein the interconnect includes a frusto-conical form factor, and wherein the interconnect fills a contact corridor in the encapsulation material to make the frusto-conical form factor, further including: an electrical-bump mass that is an integral portion of the interconnect, wherein the electrical-bump mass extends beyond the encapsulation height; and a board onto which the electrical bump mass is electrically bonded to a bond pad.

In Example 7, the subject matter of any one or more of Examples 1-6 optionally include wherein the interconnect includes a stepped right-cylinder form factor.

In Example 8, the subject matter of any one or more of Examples 1-7 optionally include wherein the interconnect includes a stepped right-cylinder form factor, further including an electrical-bump mass that is an integral portion of the interconnect, wherein the electrical-bump mass extends beyond the encapsulation height.

In Example 9, the subject matter of any one or more of Examples 1-8 optionally include wherein the interconnect includes a stepped right-cylinder form factor, further including: an electrical-bump mass that is an integral portion of the interconnect, wherein the electrical-bump mass extends beyond the encapsulation height, and a board onto which the electrical bump mass is electrically bonded to a bond pad.

In Example 10, the subject matter of any one or more of Examples 1-9 optionally include wherein the interconnect includes a stepped right-cylinder form factor, and wherein the interconnect fills a contact corridor in the encapsulation material to make the stepped right-cylinder form factor, further including: an electrical-bump mass that is an integral portion of the interconnect, wherein the electrical-bump mass extends beyond the encapsulation height; and a board onto which the electrical bump mass is electrically bonded to a bond pad.

In Example 11, the subject matter of any one or more of Examples 1-10 optionally include wherein the interconnect includes a stepped right-cylinder form factor, wherein the stepped right-cylinder form factor includes a first portion, a second portion and a subsequent portion.

In Example 12, the subject matter of any one or more of Examples 1-11 optionally include wherein the interconnect includes a stepped right-cylinder form factor, wherein the stepped right-cylinder form factor includes a first portion, a second portion and a subsequent portion, further including an electrical-bump mass that is an integral portion of the interconnect, wherein the electrical-bump mass extends beyond the encapsulation height.

In Example 13, the subject matter of any one or more of Examples 1-12 optionally include wherein the interconnect includes a stepped right-cylinder form factor, wherein the stepped right-cylinder form factor includes a first portion, a second portion and a subsequent portion, further including: an electrical-bump mass that is an integral portion of the interconnect, wherein the electrical-bump mass extends beyond the encapsulation height; and a board onto which the electrical bump mass is electrically bonded to a bond pad.

In Example 14, the subject matter of any one or more of Examples 1-13 optionally include wherein the encapsulation material also contacts an anti-pad material, wherein the anti-pad material obscures a portion of the trace at the terminal end.

In Example 15, the subject matter of any one or more of Examples 1-14 optionally include a semiconductive device disposed on the semiconductor package substrate die side, wherein the semiconductive device is flip-chip bonded to the semiconductor package substrate by an electrical bump from a ball array.

In Example 16, the subject matter of any one or more of Examples 1-15 optionally include a semiconductive device disposed on the semiconductor package substrate die side, wherein the semiconductive device is face-mounted on the die side by direct contact.

In Example 17, the subject matter of any one or more of Examples 1-16 optionally include a passive device disposed on the land side, wherein the passive device is at least partially encapsulated by the encapsulation material.

Example 18 is a method of forming an encapsulated interconnect, comprising: forming an encapsulation material on a land side of a semiconductor package substrate to contact a trace on the land side, wherein the encapsulation material includes an encapsulation height; forming a via in the encapsulation material; seating a vertical interconnect in the via at a terminal end of the trace, wherein the vertical interconnect includes a portion that extends beyond the encapsulation height, and wherein the vertical interconnect exhibits a form factor selected from frusto-conical and stepped right-cylindrical.

In Example 19, the subject matter of Example 18 optionally includes wherein forming the via includes: drilling a tapered via in the encapsulation material to expose the trace at a terminal end; and filling the tapered via by a process selected from electroplating and solder printing.

In Example 20, the subject matter of any one or more of Examples 18-19 optionally include wherein forming the via includes: drilling a first right-cylindrical via in the encapsulation material to expose the trace at a terminal end; drilling a subsequent right-cylindrical via in the encapsulation material, wherein the subsequent right-cylindrical via has a subsequent characteristic dimension and the first right-cylindrical via has a first characteristic dimension that is smaller than the subsequent characteristic dimension; and filling the tapered via by a process selected from electroplating and solder printing.

In Example 21, the subject matter of any one or more of Examples 18-20 optionally include assembling the vertical interconnect to a land side substrate at the portion that extends beyond the encapsulation height, and under conditions to form an electrical bump mass between the encapsulation height and the land side substrate.

Example 22 is a computing system, comprising: a semiconductor device substrate including a die side and a land side; a trace on the land side wherein the trace is coupled to the die side; an encapsulation material that contacts the land side and the trace, wherein the encapsulation material includes an encapsulation height; an interconnect that penetrates the encapsulation material and contacts the trace at a terminal end thereof, wherein the interconnect has a first characteristic dimension that contacts the trace, and a second characteristic dimension that emerges from the encapsulation material, wherein the second characteristic dimension is larger than the first characteristic dimension, and wherein the vertical interconnect includes a portion that extends beyond the encapsulation height; a semiconductive device disposed on the semiconductor package substrate die side; a board that is bonded to the portion that extends beyond the encapsulation height; and a chipset coupled to the semiconductive device.

In Example 23, the subject matter of Example 22 optionally includes wherein the semiconductive device is a first semiconductive device, further including a subsequent semiconductive device coupled to the die side.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

With semiconductive devices, an "active surface" includes active semiconductive devices and may include metallization that connects to the active semiconductive devices. A "backside surface" is the surface opposite the active surface.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A method of forming an encapsulated interconnect, the method comprising:
    forming an encapsulation material on a land side of a semiconductor package substrate to contact a trace on the land side, the encapsulation material having an encapsulation height;
    forming a via in the encapsulation material;
    depositing a vertical interconnect in the via at a terminal end of the trace, the vertical interconnect having a portion that extends beyond the encapsulation height, the vertical interconnect having a stepped right-cylindrical cross-sectional area;
    drilling a first right-cylindrical via in the encapsulation material to expose the trace at a terminal end, the first right-cylindrical via having a first characteristic dimension;
    drilling a second right-cylindrical via in the encapsulation material after drilling the first right-cylindrical via, the second right-cylindrical having a second characteristic dimension that is larger than the first characteristic dimension wherein the first characteristic dimension is a height of the first right-cylindrical via and the second characteristic dimension is a height of the second right-cylindrical via; and
    filling the via by a process selected from electroplating and solder printing.

2. The method of claim 1, further comprising assembling the vertical interconnect to a land side substrate at the portion that extends beyond the encapsulation height, and under conditions to form an electrical-bump mass between the encapsulation height and the land side substrate, the electrical-bump mass being an integral portion of the vertical interconnect.

3. The method of claim 1, wherein the vertical interconnect fills a contact corridor in the encapsulation material.

4. The method of claim 1, wherein the encapsulation material is a single material layer having a dielectric constant range of about 1.5 to about 4 and that substantially fills a space between adjacent vertical interconnects from traces that connect to the adjacent vertical interconnects to a top of the vertical interconnects.

5. The method of claim 1, further comprising coupling a passive device on the land side and at least partially encapsulating the passive device using the encapsulation material.

6. The method of claim 1, further comprising flip-chip bonding a semiconductive device to a die side of the semiconductor package substrate using an electrical bump from a ball array.

7. The method of claim 1, further comprising face-mounting a semiconductive device to a die side of the semiconductor package substrate by direct contact.

8. The method of claim 1, wherein the encapsulation material also contacts an insulating material that obscures a portion of the trace at the terminal end.

9. The method of claim 8, wherein:
    the terminal end of the trace is substantially circular, and
    the vertical interconnect contacts the terminal end of the trace through the insulating material, which electrically insulates the terminal end of the trace from the vertical interconnect.

10. The method of claim 8, wherein the terminal end of the trace that is exposed through the insulating material is ovular or rectangular.

11. A method of forming an encapsulated interconnect, the method comprising:
forming an encapsulation material on a land side of a semiconductor package substrate to contact a trace on the land side, the encapsulation material having an encapsulation height;
forming a via in the encapsulation material;
depositing a vertical interconnect in the via at a terminal end of the trace, the vertical interconnect having a portion that extends beyond the encapsulation height, the vertical interconnect having a frusto-conical cross-sectional area or a stepped right-cylindrical cross-sectional area, and wherein the vertical interconnect has a first height that extends from the trace to a plane at which the vertical interconnect emerges from the encapsulation material, a second height that extends beyond the encapsulation height, and a diameter on the plane at which the vertical interconnect emerges from the encapsulation material; and
assembling the vertical interconnect to a land side substrate at the portion that extends beyond the encapsulation height, and under conditions to form an electrical-bump mass between the encapsulation height and the land side substrate, the electrical-bump mass being an integral portion of the vertical interconnect, the second height being a height of a meniscus formed by the electrical-bump mass.

12. The method of claim 11, wherein the first height divided by the second height is in a range of about 1.5 to about 4.5.

13. The method of claim 12, wherein the first height divided by the diameter is in a range of about 1.1 to about 2.5.

14. The method of claim 11, wherein the first height divided by the diameter is in a range of about 1.1 to about 2.5.

* * * * *

UNITED STATES PATENT AND TRADEMARK OFFICE
CERTIFICATE OF CORRECTION

| | | |
|---|---|---|
| PATENT NO. | : 11,887,917 B2 | Page 1 of 1 |
| APPLICATION NO. | : 17/218384 | |
| DATED | : January 30, 2024 | |
| INVENTOR(S) | : Bok Eng Cheah et al. | |

It is certified that error appears in the above-identified patent and that said Letters Patent is hereby corrected as shown below:

On the Title Page

Item (30), under "Foreign Application Priority Data", in Column 1, Line 1, delete "2018701318" and insert -- PI 2018701318 --, therefor.

Signed and Sealed this
Twenty-seventh Day of August, 2024

*Katherine Kelly Vidal*

Katherine Kelly Vidal
*Director of the United States Patent and Trademark Office*